United States Patent [19]

Borg

[11] 4,387,400

[45] Jun. 7, 1983

[54] TUNING SYSTEM FOR A TELEVISION RECEIVER

[75] Inventor: Arthur N. Borg, Lake Forest, Ill.

[73] Assignee: Zenith Radio Corporation, Glenview, Ill.

[21] Appl. No.: 262,169

[22] Filed: May 11, 1981

[51] Int. Cl.³ .......................... H04N 5/44; H04N 5/50
[52] U.S. Cl. .............................. 358/191.1; 455/182; 455/192
[58] Field of Search ............... 358/191.1, 192.1, 193.1; 334/86; 455/154, 160, 161, 165, 173, 182, 183, 185, 186, 192

[56] References Cited

U.S. PATENT DOCUMENTS

| | | | |
|---|---|---|---|
| 4,038,689 | 7/1977 | Rzeszewski | 455/183 |
| 4,234,962 | 11/1980 | Hoeft | 358/182 |
| 4,270,145 | 5/1981 | Farina | 455/183 |
| 4,280,140 | 7/1981 | Skerlos | 358/195.1 |
| 4,307,422 | 12/1981 | Das | 358/193.1 |
| 4,317,226 | 2/1982 | Belisomi | 455/183 |

Primary Examiner—Tommy P. Chin
Attorney, Agent, or Firm—Jack Kail

[57] ABSTRACT

A tuning system is described for use with a television receiver which has channel selection keys on a keyboard for selecting a desired television channel. The system employs a frequency synthesizer for tuning the receiver's local oscillator to a selected television channel. For fine tuning, the system employs a fine tuning key which doubles as a channel selection key. Actuation of this key places the system in a fine tuning mode, and a logic circuit responds to actuation of a channel-up or channel-down key for causing the receiver to be fine tuned in the selected direction. In the preferred embodiment, fine tuning and channel selection are controlled by the logic circuit so as to occur during the receiver's vertical interval to eliminate digital switching noise from the receiver's image.

7 Claims, 3 Drawing Figures

TUNING SYSTEM FOR A TELEVISION RECEIVER

BACKGROUND OF THE INVENTION

This invention is generally directed to improvements in television receivers, and particularly to an improved tuning system for television receivers.

Television receivers of the type under consideration frequently include a frequency synthesizer for tuning the receiver's local oscillator to the nominal carrier frequency of a selected television channel. Generally, the frequency synthesizer compares the local oscillator frequency to a reference frequency associated with the selected channel, and then varies the local oscillator frequency until it equals the reference frequency. Presumably, the receiver will now be correctly tuned to the selected channel.

This method of tuning the receiver relies, of course, on the frequency of the incoming television signal being equal to its nominal or standard frequency. However, when the incoming signal is derived from a video game or other non-standard signal source, the incoming frequency may be non-standard. In that case, a receiver having a frequency synthesizer but no AFC or fine tuning knob cannot tune the receiver to the frequency of the non-standard incoming signal.

Some television receivers do include an AFC control but lack a fine tuning knob which the customer can adjust. However, the AFC control cannot generally be designed to cope with all off frequency signals because of the characteristics of television broadcasting systems. Therefore, even with an AFC control, the receiver may not be able to properly tune to all non-standard signals, such as those which are off frequency by 1.25 megahertz or more.

In addition, when poor signal conditions are present, it is sometimes desirable to tune the receiver off frequency to obtain a crisper picture. Of course, this cannot be done without a manual fine tuning knob.

The inclusion of both AFC and a manual fine tuning knob overcomes the problems described above, but only at a cost penalty since both are relatively expensive, particularly for low cost television receivers. The present invention overcomes these problems in a relatively inexpensive manner.

Another problem associated with conventional frequency synthesizers is that their digital circuits tend to inject noise into the receiver's television image. Costly filters have generally been required to reduce such noise to acceptable levels. The present invention also reduces this noise problem without the need for expensive or elaborate filters.

OBJECTS OF THE INVENTION

It is a general object of the invention to provide an improved tuning system for a television receiver.

It is a more specific object of the invention to provide a tuning system capable of being fine tuned to non-standard signal sources and capable of being selectively tuned off frequency during poor signal conditions, all without the need for AFC or a conventional fine tuning knob.

It is another object of the invention to provide such a tuning system which does not inject noise into the television image.

BRIEF DESCRIPTION OF THE FIGURES

The objects stated above and other objects of the invention are set forth more particularly in the following detailed description of the accompanying drawings, of which.

DESCRIPTION OF THE PREFERRED EMBODIMENT

Figure 1:
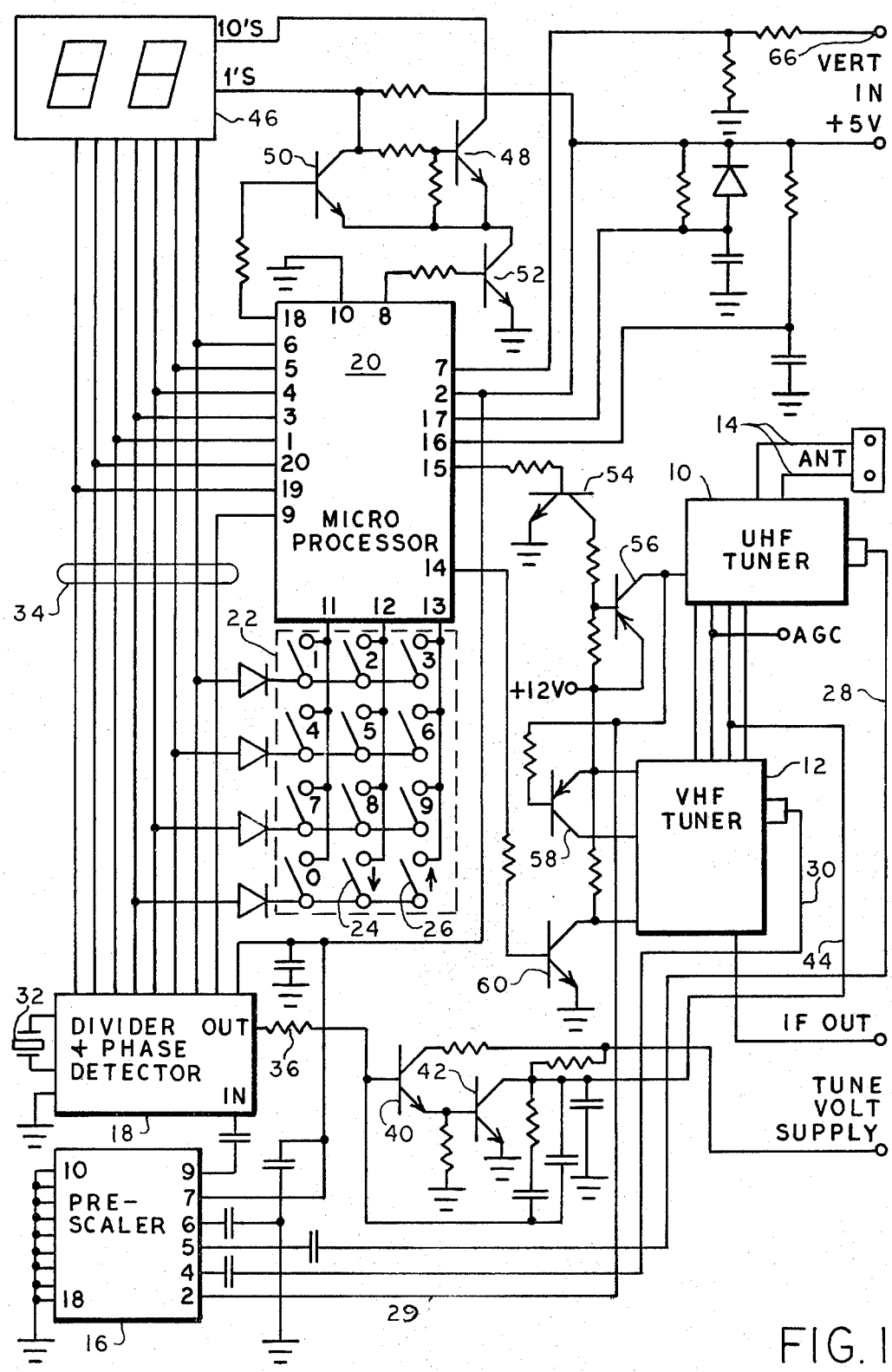
FIG. 1 is a circuit diagram of a preferred embodiment of the invention.

Referring to FIG. 1, a tuning system is shown for use in tuning the local oscillators of a UHF tuner 10 and a VHF tuner 12. These tuners receive television signals via a pair of leads 14 which are conventionally coupled to an antenna (not shown).

To tune the local oscillators in the tuners 10 and 12, a frequency synthesizer is included. The synthesizer includes a pre-scaler 16, a divider and phase detector 18, and a logic circuit in the form of a microprocessor 20. Coupled to the microprocessor is a keyboard 22 which includes ten channel selection keys or switches. Adjacent each key is a single digit number to identify the channel number which can be selected by actuation of the key. For example, if channel 32 is to be selected, the viewer closes keys 3 and 2. If a single digit channel is to be selected, the present embodiment requires that the zero key be actuated first, and then the key associated with the desired channel. Thus, the keys zero and seven would be actuated to select channel seven.

A different channel can also be selected by closing a channel-down key 24 or a channel-up key 26. For example, when the key 26 is closed, ascending channel numbers are selected and tuned to sequentially. When a desired channel number is arrived at, the key 26 is opened and the receiver remains tuned to that desired channel. The channel-down key 24 operates in a like manner for selecting descending channel numbers.

As described below, the present invention also uses one of the ten channel selection keys as a fine tuning selection and keys 24 and 26 for selecting the direction of fine tuning.

Assuming that the viewer has actuated one or more of the keys to select a channel, tuning of the oscillators occurs as follows. Leads 28 and 30 carry local oscillator signals from the tuners 10 and 12, respectively, to input pins 4 and 5 of the pre-scaler 16. Another lead 29 indicates to the pre-scaler whether to process the signal at pin 4 or the signal at pin 5, depending on which tuner is operative. Assuming that the UHF tuner is operative, the pre-scaler 16 divides the local oscillator signal at pin 5 by a fixed number such as 256, and outputs the pre-scaled oscillator signal at pin 9.

The device 18 receives the pre-scaled oscillator signal at its input in addition to a reference oscillator signal developed by a crystal 32. The device 18 divides the reference frequency by a number R which is determined by the microprocessor 20 and supplied to the divider and phase detector 18 via leads 34. The number R is fixed except when a fine tuning mode has been selected by the viewer.

The leads 34 carry information from the microprocessor 20 for instructing the device 18 to divide the pre-scaled oscillator signal by a number P. The latter number is determined by the microprocessor sensing which channel selection keys have been closed in the keyboard 22.

After dividing the reference frequency by the number R and dividing the pre-scaled oscillator signal by the number P, the device 18 compares the two divided signals to each other. Any deviation from equality is assumed to be caused by mis-tuning of the UHF tuner's oscillator, wherefore, the device 18 outputs a correction signal at its output terminal.

The correction output by the divider and phase detector is coupled via a resistor 36 to transistors 40 and 42 and their associated circuitry for amplifying, integrating and filtering the correction signal. The filtered output of transistor 42 is then coupled via a lead 44 to the tuner 10 for correcting the frequency of that tuner's local oscillator. A similar sequence of events occurs when the VHF tuner 12 is being tuned.

To identify which channel the receiver is tuned to, a digital display 46 is included. This display includes a pair of digits which are illuminated under the control of the microprocessor 20. Specifically, the tens digit of the display 46 is coupled to the collector of a transistor 48 which is driven by another transistor 50 from pin 18 of the microprocessor. The units digit of the display is connected to the collector of the transistor 50. In response to the information provided by the microprocessor, the transistors 48 and 50 select the correct tens and units digit for illumination.

The on and off time of the display 46 is controlled by another transistor 52 whose base is coupled to pin 8 of the microprocessor. Whenever pin 8 goes high, the transistor 52 conducts to turn on the display.

Another function of the microprocessor is to select either the UHF tuner of the VHF tuner for operation, depending on the channel selected by the viewer. This is accomplished by coupling pin 15 of the microprocessor to the tuners via transistors 54, 56, and 58. Thus, the UHF tuner is turned off and the VHF tuner is turned on, or vice versa.

When the VHF tuner is selected, another transistor 60 which is coupled to pin 14 of the microprocessor selects either the high band of VHF channels (channels 7-13) or the low band of VHF channels (channels 2-6).

The operation described immediately above is largely conventional. The description which follows illustrates how fine tuning is achieved and how injection of noise into the video image is avoided.

In the keyboard 22, each of the channel selection keys is associated with an integer zero through nine. As described previously, the illustrated embodiment requires that a single digit channel (channel 7, for example) be selected by first closing the selection key zero and by then closing the channel selection key associated with the desired single digit channel.

According to one aspect of the invention, one of the channel selection keys also functions as a fine tuning selection key. This fine tuning selection key is, when it functions as a channel select key, associated with a channel number N, where N does not correspond to the first digit of a two digit channel. Preferably, the channel 9 key is selected to function both as a channel selection key and as a fine tuning selection key.

When a viewer wishes to fine tune the receiver, the channel 9 key is closed without first closing the zero key. The microprocessor is programmed to interpret this action as a request for fine tuning, and it actuates the display 46 to give an indication that the receiver is in a fine tuning mode. This is preferably accomplished by causing the letter F to be displayed.

With the system now in a fine tuning mode, the channel-up key 26 and the channel-down key 24 no longer function to select ascending or descending channels. Instead, the microprocessor now responds to the actuation of either the channel-up key 26 or the channel-down key 24 for implementing the requested fine tuning. In addition, the microprocessor is selected to undertake its digital switching chores only at the initiation of a vertical interval so that any noise resulting from digital switching does not occur during the receiver's active scan time. Hence, digitally induced noise is eliminated from the television image.

The way in which fine tuning is achieved will be described with reference to the flow charts shown in FIGS. 2 and 3. These flow charts depict the programming of the microprocessor in a general way. They do not include conventional steps such as debouncing of the keyboard 22, internal housekeeping functions, and the like. The details of the entire program for a type 411 microprocessor manufactured by National Semiconductor is illustrated in the appendix hereto.

Figure 2:
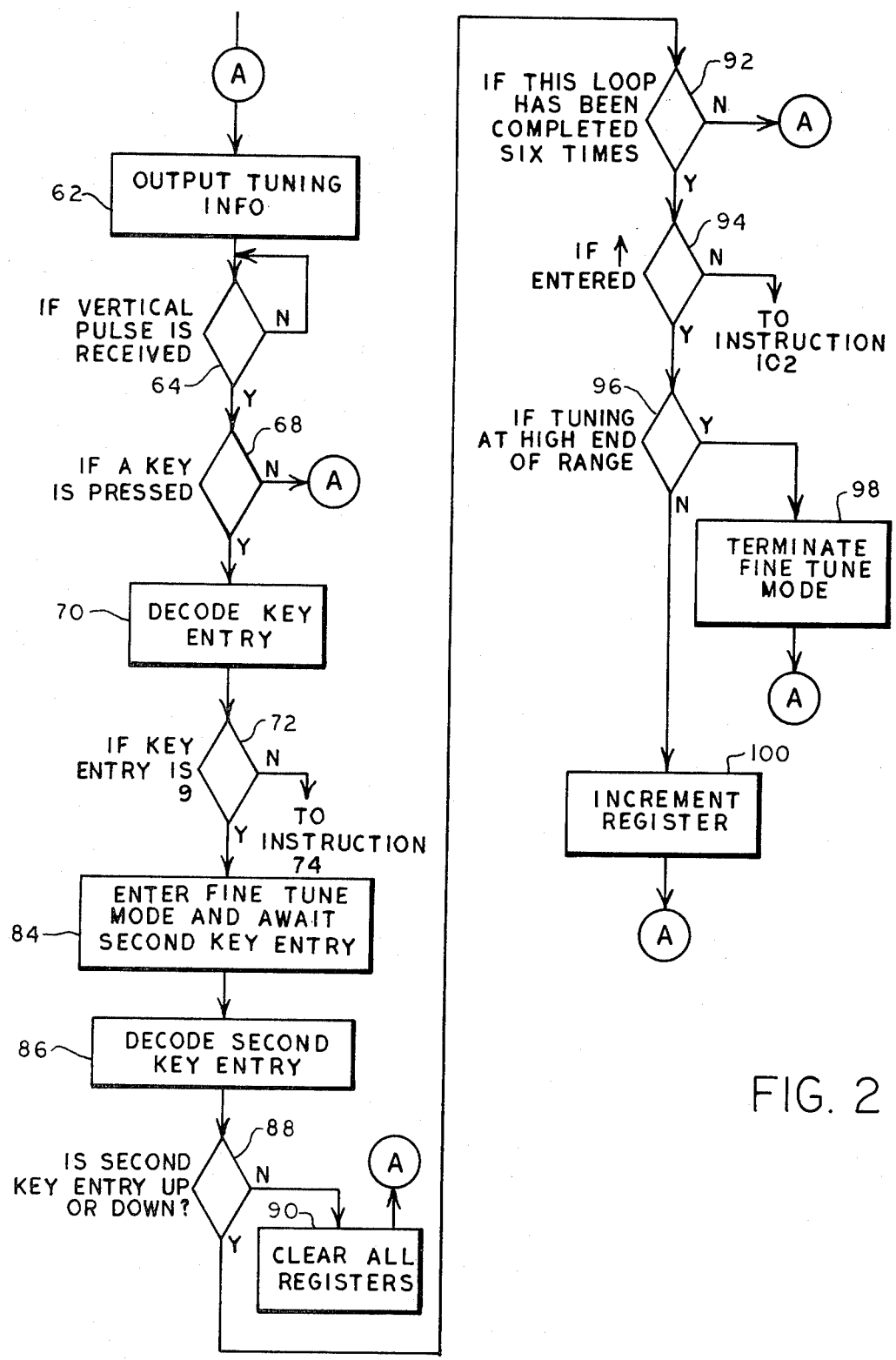
FIGS. 2 and 3 are flow charts depicting the logic employed by the microprocessor of FIG. 1.
Figure 3:
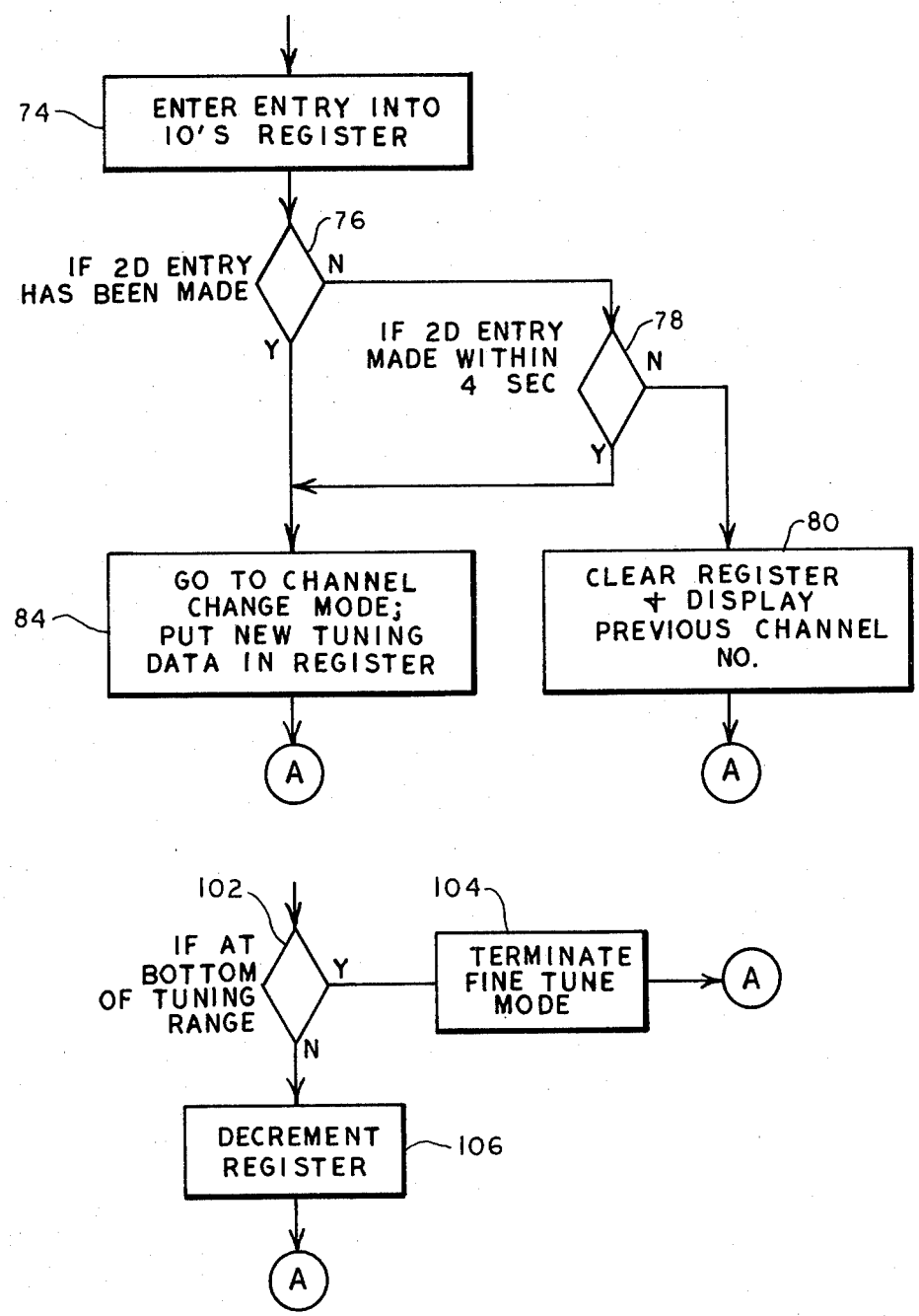

Referring to FIG. 2, the program begins at an entry point A which defines the start of the first instruction 62. This first instruction causes the microprocessor to output any previously developed tuning information to the rest of the frequency synthesizer via the leads 34. Next, instruction 64 determines whether a vertical pulse is being received at pin 7 of the microprocessor 20 via an input terminal 66. If no such pulse is being received, the program loops around the instruction 64 until the receiver develops and applies to the microprocessor 20 a vertical rate pulse. When such a pulse is received, the program continues to instruction 68.

According to instruction 68, the microprocessor now determines if a key is being pressed in the keyboard 22. If no key is pressed, the program returns to the entry point A and proceeds through the program again. However, if a key is sensed as being pressed, the program continues to instruction 70 for decoding the key entry which is being made.

According to instruction 72, the microprocessor now determines if this first key entry is the key associated with channel 9. If the channel 9 key is not the first key entry, this indicates that the receiver is not to go into a fine tuning mode, wherefore the program proceeds to instruction 74 in FIG. 3. The latter instruction causes the microprocessor to enter the key entry into its tens register and then proceed to the next instruction 76. The instruction 76 inquires if a second key entry has been made. If not, the program continues to instruction 78 to determine if a second keyboard entry has been made within four seconds of the last entry. If no such second entry has been made, the microprocessor proceeds to instruction 80 which causes it to clear its register and display the previous channel number on the display 46. The program then returns to the entry point A to proceed through the program again, beginning with the first instruction.

If a second entry has been made (instruction 76) or if a second entry had been made within four seconds of the first entry (instruction 78), the program proceeds from instructions 76 or 78 to instruction 84. This instruction causes the microprocessor to go into its channel change mode and put new tuning data in its register. The microprocessor then goes to entry point A and the first instruction 62 causes the microprocessor to output this newly entered tuning information to the rest of the frequency synthesizer. The frequency synthesizer then tunes the appropriate local oscillator for receiving the newly selected channel as described above.

Although not shown in the simplified flow chart, the microprocessor responds to the channel-up and channel-down keys for quickly selecting successive ascending or descending channel members if either of those keys are closed without the key entry 9 having been made first.

Returning now to FIG. 2, if the first key entry had been the number 9, the microprocessor would have proceeded from instruction 72 directly to instruction 84. This causes the microprocessor to enter a fine tuning mode and to wait for the entry of a second key. Instruction 86 causes the microprocessor to decode the second key entry and to advance it to the next instruction 88.

Instruction 88 determines whether the second key entry is channel-up or channel-down. That is, it determines whether either the channel-up key 26 or the channel-down key 24 are closed. If neither are closed, this indicates an operator error, wherefore the program continues to instruction 90 which causes the microprocessor to clear all registers and to return to entry point A. If the second key entry had been either a channel-up entry or a channel-down entry, the microprocessor would have proceeded directly from instruction 88 to instruction 92 to determine if the microprocessor had looped through instructions 62 through 92 six times. This insures that the microprocessor will have gone through instructions 62 through 92 for six vertical intervals before proceeding further in order to slow down the rate at which fine tuning is effected. This gives the viewer time to see the effect of fine tuning on the television image and to precisely control the amount of fine tuning which is accomplished.

When the microprocessor has looped through instructions 62 through 92 six times, the program continues to instruction 94. This instruction determines whether the channel-up key 26 has been entered. If this key has been entered, the program continues to instruction 96 to determine whether the system is at the high end of a range beyond which it cannot tune. If it has reached the high end of its tuning range, the program continues to instruction 98 to terminate the fine tuning mode. The microprocessor then advances back to the entry point A to loop through the program again.

If the fine tuning range has not been reached when instruction 96 is executed, the program continues to instruction 100 for incrementing a register within the microprocessor. The program then returns to entry point A and to instruction 62 for outputting the information contained in that register to effect fine tuning. By way of example, instructions 100 and 62 may cause the device 18 to change the number by which it divides the crystal frequency from 3667 to 3666. If the receiver is fine tuning channel 2, this will result in approximately a 25 kilohertz change in the tuning of the local oscillator. Thus, the frequency synthesizer changes the frequency of the local oscillator by selected increments or decrements during a plurality of vertical intervals to slow down the rate at which fine tuning is effected.

Returning to instruction 94, if the microprocessor sensed that the channel-up key was not entered, this means that the channel-down key must have been entered. Therefore, the program advances to instruction 102 in FIG. 3. This instruction determines if the system is at the bottom of its turning range. If that bottom has been reached, the program advances to instruction 104 for terminating the fine tuning mode and returning to instruction 62 via the entry point A. If the bottom of the tuning range has not been reached when instruction 102 was executed, the program advances to instruction 106 to decrement the microprocessor's fine tuning register and to advance to the first instruction 62 via entry point A for outputting its tuning information to the rest of the frequency synthesizer.

The foregoing description demonstrates how fine tuning can be achieved by a frequency synthesizer tuning system having neither AFC nor a conventional fine tuning knob. This enables a viewer to fine tune the receiver to non-standard signal sources and to deliberately mistune the receiver under noisy or poor signal conditions.

In addition, digital switching noise is eliminated from the receiver's image because the microprocessor causes tuning and fine tuning to be initiated only during the receiver's vertical interval.

In construction, the UHF and VHF tuners may be conventional. The pre-scaler 16 may be a Siemens Halske SDA 4041 and the device 18 may be a type MN6044 made by Matsushita, for example. The microprocessor may be a National 411 and may be programmed as shown in the appendix hereto.

Although the invention has been described in terms of a preferred embodiment, it will be obvious to those skilled in the art that many alterations and modifications can be made without departing from the invention. Accordingly, it is intended that all such alterations and modifications be considered as within the spirit and scope of the invention as defined by the appended claims.

Appendix

Instruction Set For Microprocessor

| 000 | 00 | 33 | 60 | 1C | 72 | 70 | 70 | 61 | 69 | 0C | 22 | 00 | 30 | 44 | 04 | 00 |
|-----|----|----|----|----|----|----|----|----|----|----|----|----|----|----|----|----|
| 010 | 30 | 44 | 06 | 33 | 60 | 28 | 05 | 50 | 56 | 44 | 33 | 3C | 22 | 33 | 65 | 4F |
| 020 | 44 | 32 | 4F | 28 | 01 | EA | 1D | 00 | 55 | ED | 1C | 00 | 54 | BF | 00 | 28 |
| 030 | 05 | 51 | F5 | 00 | 5A | 06 | 2F | 33 | 6C | 05 | 4F | 57 | F9 | 60 | 5B | 00 |
| 040 | 3F | 06 | 5B | 4F | 66 | 6D | 7D | 07 | 7F | 67 | 40 | 0F | 0E | 0D | 0B | 07 |
| 050 | 80 | 86 | DB | CF | E6 | ED | FD | 87 | FF | F1 | BF | 33 | 60 | 00 | 0E | 5B |
| 060 | 21 | E5 | 3E | 70 | 00 | 2F | 33 | 3A | 2E | 33 | 3C | 33 | 64 | 0E | 33 | 2A |
| 070 | 33 | 60 | 51 | 60 | 90 | 40 | 13 | 60 | 89 | 03 | FC | 31 | 06 | 4B | 00 | 0D |
| 080 | 21 | 60 | 09 | 3C | 25 | 24 | 25 | 06 | A1 | 03 | 60 | 7B | 5C | 44 | 60 | 7C |
| 090 | 3E | 35 | 55 | D0 | 00 | 0D | 21 | 9A | 61 | 0A | 59 | 1D | 21 | BD | 51 | 28 |
| 0A0 | 21 | 60 | 13 | 51 | 3E | 21 | B6 | 2A | 21 | AB | BD | 00 | 29 | 22 | 30 | 44 |
| 0B0 | 04 | 00 | 30 | 44 | 06 | A1 | 2A | 00 | 21 | C3 | 29 | 21 | C3 | 0C | 70 | 70 |
| 0C0 | 7F | 60 | 83 | 29 | 32 | 40 | 30 | 44 | 04 | 00 | 40 | 30 | 44 | 06 | 60 | 13 |
| 0D0 | 43 | 00 | 21 | 60 | 75 | 0B | 5C | 06 | 00 | 54 | BF | 33 | 64 | 2F | 33 | 3A |
| 0E0 | 0B | 33 | 2A | 33 | 60 | 51 | F3 | 51 | 30 | EB | CE | 06 | 00 | 3E | 05 | 53 |
| 0F0 | 06 | 0B | D8 | 5F | 44 | 40 | 5C | 51 | 53 | 44 | 3E | 31 | 36 | 7F | 3E | 00 |
| 100 | 5A | 21 | C4 | 70 | 0D | 22 | 00 | 21 | 61 | 44 | 3E | 05 | 54 | EA | 1E | 21 |

Appendix-continued

Instruction Set For Microprocessor

| | | | | | | | | | | | | | | | | |
|---|---|---|---|---|---|---|---|---|---|---|---|---|---|---|---|---|
| 110 | E1 | 1D | 05 | 57 | D6 | DD | 51 | DB | 1C | 05 | 5D | 61 | 4F | 1C | 72 | 70 |
| 120 | F9 | 00 | 28 | 01 | 51 | 1E | 31 | 06 | 60 | 13 | 51 | FB | 1E | 21 | E1 | 1D |
| 130 | 21 | F5 | 1C | 52 | 21 | 61 | 5B | 73 | 78 | 61 | 68 | 5B | 44 | 1D | 07 | 7A |
| 140 | 0D | 71 | 60 | 13 | 3E | 05 | 55 | CB | 00 | 60 | 9A | 05 | 1C | 06 | E9 | 1C |
| 150 | 22 | 00 | 56 | 30 | 5A | 44 | 04 | 00 | 30 | 04 | E8 | 1C | 32 | 00 | 40 | 30 |
| 160 | 5A | 44 | 04 | 00 | 40 | 30 | 44 | 04 | 71 | 1C | 25 | 24 | 25 | 06 | 0C | 70 |
| 170 | 70 | 7F | 00 | 28 | 7A | 73 | 75 | 72 | 73 | 70 | 70 | 7F | 3D | 21 | 61 | AD |
| 180 | 50 | 33 | 3E | 51 | 3C | 21 | CF | 51 | 50 | 33 | 3E | 2B | 72 | 7F | EB | 51 |
| 190 | 21 | D3 | EB | 51 | 21 | D9 | 2B | 75 | EB | 51 | 21 | DF | 2B | 78 | EB | 51 |
| 1A0 | 21 | E5 | 2B | 7D | EB | 51 | 21 | F4 | 2B | 70 | 74 | 60 | 13 | 51 | 21 | F6 |
| 1B0 | 3C | 05 | 32 | 5C | 61 | C0 | 00 | 52 | 50 | 33 | 3E | 2B | 78 | 7D | 61 | C8 |
| 1C0 | 00 | 51 | 50 | 33 | 3E | 2B | 79 | 75 | 2B | 00 | 32 | 53 | 30 | 44 | 04 | 00 |
| 1D0 | 30 | 44 | 04 | 00 | 30 | 06 | 3C | 00 | 40 | 30 | 5A | 44 | 04 | 00 | 40 | 30 |
| 1E0 | 44 | 06 | 00 | 21 | C8 | 07 | 21 | C8 | 1C | 25 | 24 | 25 | 06 | 60 | 13 | 00 |
| 1F0 | 00 | 00 | 00 | 00 | 00 | 00 | 00 | 00 | 00 | 00 | 00 | 00 | 00 | 00 | 00 | 00 |

What is claimed is:

1. In a television receiver having a local oscillator as part of a tuner, and having a frequency synthesizer for tuning the local oscillator, an improved tuning system, comprising:
a keyboard including a plurality of viewer actuable channel selection keys zero through nine for entering a selected channel number to which the frequency synthesizer is to tune the local oscillator, actuation of a selected one of said channel selection keys defining a fine tuning mode of operation wherein the selected channel selection key is associated with a channel number N, where N does not correspond to the first digit of a two digit channel number;
a channel-up key for commanding the frequency synthesizer to change the frequency of the local oscillator in a first direction;
a channel-down key for commanding the frequency synthesizer to change the frequency of the local oscillator in a second, opposite direction; and
a logic circuit associated with the frequency synthesizer and coupled to the keyboard, the channel-up key, and the channel-down key, said logic circuit being responsive to viewer actuation of two keys of the keyboard in sequence for placing the synthesizer in a direct access mode of operation for causing the frequency synthesizer to adjust the local oscillator frequency for changing channels, and being responsive to actuation of the selected channel selection key for placing the frequency synthesizer in a fine tuning mode of operation wherein actuation of the channel-up key causes the frequency synthesizer to fine tune the local oscillator in the first direction, actuation of the channel-down key causes the frequency synthesizer to tune the local oscillator in the second, opposite direction and non-actuation of either the channel-up or channel-down key within a predetermined time interval causes the frequency synthesizer to be removed from the fine tuning mode of operation.

2. A fine tuning system as set forth in claim 1 wherein said logic circuit is adapted to actuate the frequency synthesizer for fine tuning the local oscillator and for changing channels in response to the receiver being in its vertical interval, thereby avoiding the injection of digital switching noise into the receiver's image.

3. A fine tuning system as set forth in claim 1 wherein the receiver includes a channel number display, and wherein the logic circuit is adapted to cause the channel number display to display a fine tuning indicator in response to actuation of the selected channel selection key.

4. A fine tuning system as set forth in claim 1 wherein, when the logic circuit is in the fine tune mode, it causes the frequency synthesizer to change the frequency of the local oscillator by selected increments or decrements during a plurality of vertical intervals such that a viewer can easily see the effects of fine tuning and so that digital switching noise associated with the operation of the logic circuit is not visible in the television image.

5. A fine tuning system as set forth in claim 1 wherein the logic circuit causes the frequency synthesizer to tune the local oscillator to a single digit channel in response to viewer actuation of channel selection key zero followed by actuation of the channel selection key associated with the desired single digit channel.

6. A fine tuning system as set forth in claim 5 wherein the selected channel selection key is associated with channel number nine.

7. In a television receiver having a local oscillator as part of a tuner, and having a frequency synthesizer for tuning the local oscillator, an improved tuning system, comprising:
a keyboard including a plurality of viewer actuable channel selection keys zero through nine for entering a selected channel number to which the frequency synthesizer is to tune the local oscillator, actuation of a selected one of said channel selection keys defining a fine tuning mode of operation wherein the selected channel selection key is associated with a channel number N, where N does not correspond to the first digit of a two digit channel number;
a channel-up key for commanding the frequency synthesizer to change the frequency of the local oscillator in a first direction;
a channel-down key for commanding the frequency synthesizer to change the frequency of the local oscillator in a second, opposite direction; and
a logic circuit associated with the frequency synthesizer and coupled to the channel selection keys, to the channel-up key and to the channel-down key, said logic circuit being responsive to viewer actuation of two channel selection keys in sequence for placing the synthesizer in a direct access mode of operation for causing the frequency synthesizer to adjust the local oscillator frequency for changing channels during the receiver's vertical interval, and being responsive to actuation of the selected channel selection key for placing the frequency synthesizer in a fine tuning mode of operation wherein actuation of the channel-up key causes the frequency synthesizer to slowly fine tune the local oscillator in a first direction during vertical intervals, actuation of the channel-down key causes the frequency synthesizer to slowly tune the local oscillator in the second opposite direction during vertical intervals and non-actuation of either the channel-up or channel-down by within a predetermined time interval causes the frequency synthesizer to be removed from the fine tuning mode of operation.

* * * * *